(12) United States Patent
Sakata

(10) Patent No.: US 8,878,174 B2
(45) Date of Patent: Nov. 4, 2014

(54) SEMICONDUCTOR ELEMENT, MEMORY CIRCUIT, INTEGRATED CIRCUIT, AND DRIVING METHOD OF THE INTEGRATED CIRCUIT

(75) Inventor: Junichiro Sakata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 262 days.

(21) Appl. No.: 13/442,156

(22) Filed: Apr. 9, 2012

(65) Prior Publication Data

US 2012/0262995 A1 Oct. 18, 2012

(30) Foreign Application Priority Data

Apr. 15, 2011 (JP) ................................. 2011-090843
May 19, 2011 (JP) ................................. 2011-112792

(51) Int. Cl.
| | | |
|---|---|---|
| H01L 29/786 | (2006.01) | |
| G11C 7/10 | (2006.01) | |
| H01L 27/115 | (2006.01) | |
| G11C 11/40 | (2006.01) | |
| H01L 27/12 | (2006.01) | |
| H01L 21/84 | (2006.01) | |
| H01L 27/108 | (2006.01) | |
| G11C 13/00 | (2006.01) | |

(52) U.S. Cl.
CPC ........ H01L 29/7869 (2013.01); G11C 13/0007 (2013.01); H01L 27/1156 (2013.01); G11C 11/40 (2013.01); H01L 27/1203 (2013.01); H01L 21/84 (2013.01); H01L 27/10873 (2013.01)
USPC .................. 257/43; 257/E29.296; 365/189.05

(58) Field of Classification Search
CPC .................................................. H01L 29/7869
USPC ........................ 257/43, E29.296; 365/189.05
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phy. Lett. (Applied Physics Letters), Sep. 27, 2004, vol. 85, No. 13, pp. 2541-2543.

(Continued)

*Primary Examiner* — Huan Hoang
*Assistant Examiner* — Tri Hoang
(74) *Attorney, Agent, or Firm* — Eric J. Robinson; Robinson Intellectual Property Law Office, P.C.

(57) ABSTRACT

A novel semiconductor element contributing to an increase in circuit scale is provided. In the semiconductor element, two different electrical switches are formed using a single oxide semiconductor layer. For example, in the semiconductor element, formation of a channel (a current path) in the vicinity of a bottom surface (a first surface) of the oxide semiconductor layer and formation of a channel in the vicinity of a top surface (a second surface) of the oxide semiconductor layer are independently controlled. Therefore, the circuit area can be reduced as compared to the case two electrical switches are separately provided (for example, the case where two transistors are separately provided). That is, a circuit is formed using the semiconductor element, whereby an increase in the circuit area due to an increase in circuit scale can be suppressed.

11 Claims, 8 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,924,663 B2 | 8/2005 | Masui et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,102,161 B2 | 9/2006 | Inukai |
| 7,105,868 B2 | 9/2006 | Nause et al. |
| 7,116,131 B1 | 10/2006 | Chirania et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,629,611 B2 | 12/2009 | Inukai |
| 7,674,650 B2 | 3/2010 | Akimoto et al. |
| 7,732,819 B2 | 6/2010 | Akimoto et al. |
| 7,932,521 B2 | 4/2011 | Akimoto et al. |
| 8,067,775 B2 | 11/2011 | Miyairi et al. |
| 8,106,400 B2 | 1/2012 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0079425 A1* | 4/2010 | Yamazaki et al. ............ 345/206 |
| 2010/0092800 A1 | 4/2010 | Itagaki et al. |
| 2010/0109002 A1 | 5/2010 | Itagaki et al. |
| 2010/0140613 A1* | 6/2010 | Kimura ........................ 257/43 |
| 2010/0244029 A1* | 9/2010 | Yamazaki et al. ............ 257/52 |
| 2011/0089975 A1 | 4/2011 | Yamazaki et al. |
| 2011/0101351 A1 | 5/2011 | Yamazaki |
| 2011/0133177 A1* | 6/2011 | Suzawa et al. ................ 257/43 |
| 2011/0134683 A1 | 6/2011 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J at al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M at al., "Theoretical Analysis of IgZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IgZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230. The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of TEchnical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B; Mg, Fe, Ni, Cu, or Zn]at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3 pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol 77, pp. 245202-1-245202-6.

Orita.M et al., "Amorphous transparent conductive oxide InGaO3(ZnO)m (m<4):a Zn4s conductor,", Philosophical Magazine, 2001,vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solid), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S. Et al., "High-Performance oxide thin film transistors passivated by various gas plasmas,", 214th ECS Meeting, 2008, No. 2317, ECS.

Clarks. S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B) Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistors on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

ELECTRIC CHARGE 0

ELECTRIC CHARGE +1

ELECTRIC CHARGE 0

ELECTRIC CHARGE −1

ELECTRIC CHARGE 0

FIG. 7A
FIG. 7B
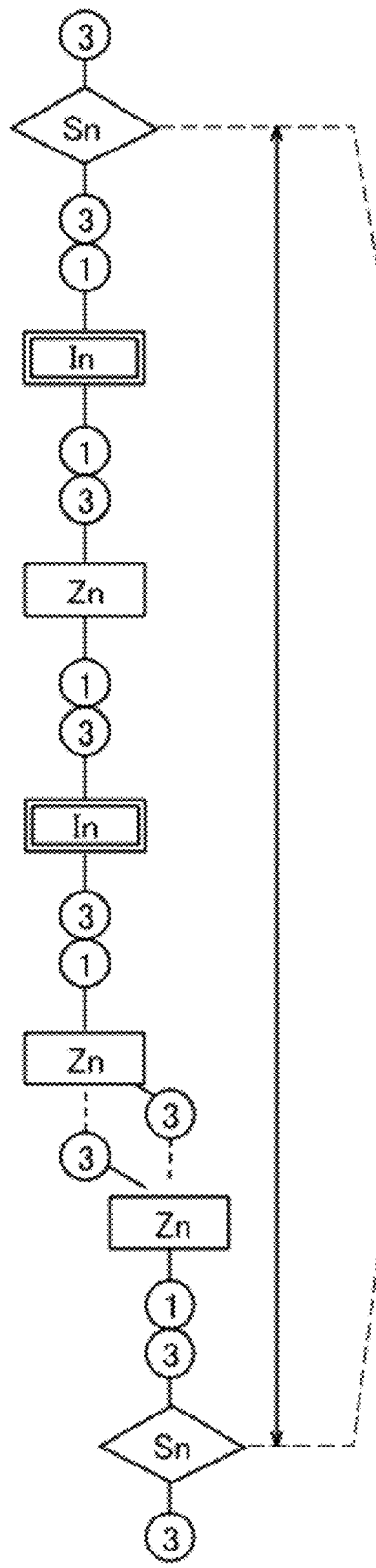
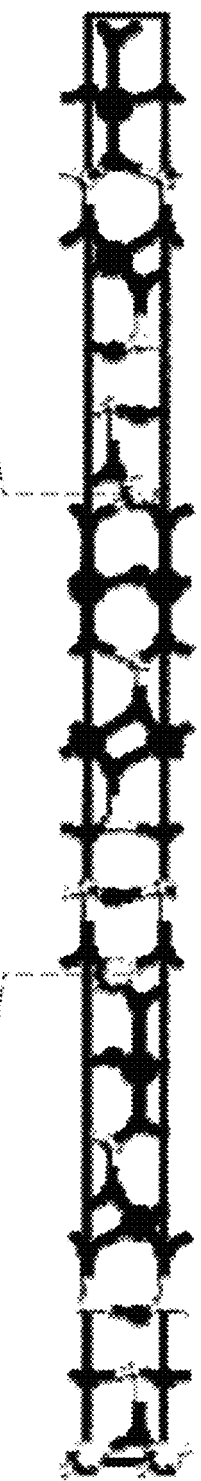
FIG. 7C
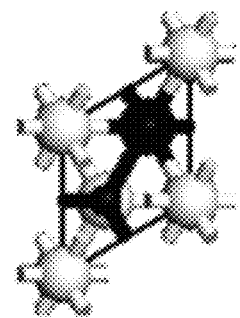
● In
◐ Sn
◑ Zn
• O

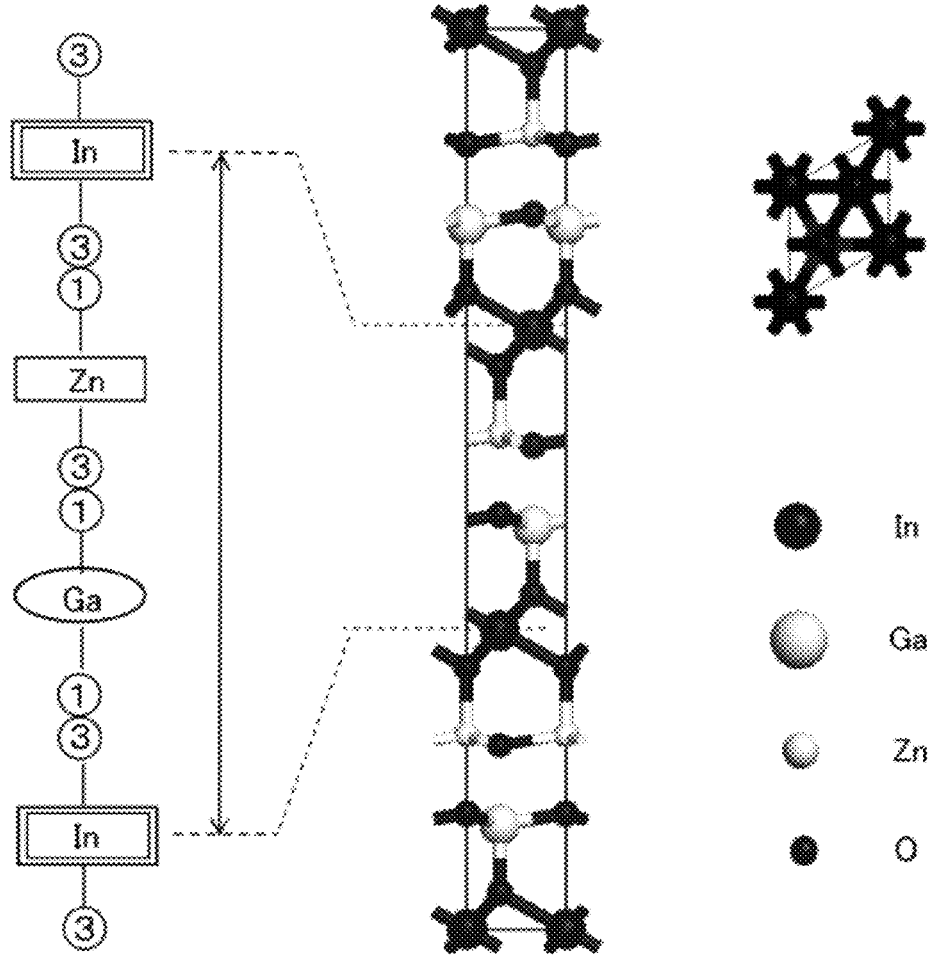

SEMICONDUCTOR ELEMENT, MEMORY CIRCUIT, INTEGRATED CIRCUIT, AND DRIVING METHOD OF THE INTEGRATED CIRCUIT

BACKGROUND OF THE INVENTION

1. Field of the Invention

The present invention generally relates to a semiconductor device. Specifically, the present invention relates to a semiconductor element having a function of an electrical switch. Further, the present invention relates to a memory circuit including the semiconductor element and an integrated circuit including the memory circuit. Furthermore, the present invention relates to a driving method of the integrated circuit.

2. Description of the Related Art

In recent years, a metal oxide having semiconductor characteristics, which is called an oxide semiconductor exhibiting high mobility and uniform element characteristics, has attracted attention as a material of a transistor. Metal oxides are used for a variety of applications. For example, indium oxide is used as a material of a pixel electrode in a liquid crystal display device. Examples of such metal oxides showing semiconductor characteristics include tungsten oxide, tin oxide, indium oxide, and zinc oxide, and transistors in each of which a channel is formed using such a metal oxide showing semiconductor characteristics have been known (Patent Documents 1 and 2).

REFERENCE

[Patent Document 1] Japanese Published Patent Application No. 2007-123861

[Patent Document 2] Japanese Published Patent Application No. 2007-096055

SUMMARY OF THE INVENTION

The above transistor is one of elements included in a circuit. For example, a central processing unit (CPU) and a digital signal processor (DSP) are integrated circuits using several ten millions or more of transistors as switches. From now on, an integrated circuit including a larger number of transistors is expected. However, a mere increase in circuit scale causes an increase in the circuit area. Therefore, in order to manufacture an integrated circuit increased in scale in a desired circuit area, research and development of miniaturization have been actively conducted on various elements. However, the research and development have been conducted for several decades and thus it is difficult to cope with a further increase in circuit scale by miniaturization of a single element.

An object of one embodiment of the present invention is to provide a novel semiconductor element contributing to an increase in circuit scale.

In a semiconductor element of one embodiment of the present invention, two different electrical switches are formed using a single oxide semiconductor layer. For example, in the semiconductor element, formation of a channel (a current path) in the vicinity of a bottom surface (a first surface) of the oxide semiconductor layer and formation of a channel in the vicinity of a top surface (a second surface) of the oxide semiconductor layer can be independently controlled.

Here, the oxide semiconductor has a wide band gap and low intrinsic carrier density. Therefore, a current generated in a region of the oxide semiconductor layer where a channel is not formed can be extremely low. Accordingly, even when channels are separately formed in the vicinity of a bottom surface of a single oxide semiconductor layer and in the vicinity of a top surface of the single oxide semiconductor layer, a current generated between the channels can be extremely low.

Specifically, one embodiment of the present invention is a semiconductor element including an oxide semiconductor layer; a first insulating layer in contact with a first surface of the oxide semiconductor layer; a second insulating layer in contact with a second surface which is a back surface of the first surface of the oxide semiconductor layer; a first conductive layer overlapping with the oxide semiconductor layer with the first insulating layer provided therebetween; a second conductive layer overlapping with the oxide semiconductor layer with the second insulating layer provided therebetween; a third conductive layer in contact with the oxide semiconductor layer at one end of the first surface; a fourth conductive layer in contact with the oxide semiconductor layer at the other end of the first surface; a fifth conductive layer in contact with the oxide semiconductor layer at one end of the second surface; and a sixth conductive layer in contact with the oxide semiconductor layer at the other end of the second surface.

In other words, one embodiment of the present invention is a semiconductor element including an oxide semiconductor layer; a first gate insulating layer and a second gate insulating layer; a first gate and a second gate; a first source and a second source; and a first drain and a second drain; in which an electric field generated in the vicinity of a first surface of the oxide semiconductor layer with the first gate insulating layer provided between the first gate and the oxide semiconductor layer is controlled in accordance with a voltage between the first gate and the first source, whereby a channel which lies between the first source and the first drain is formed in the oxide semiconductor layer; and in which an electric field generated in the vicinity of a second surface which is a back surface of the first surface of the oxide semiconductor layer with the second gate insulating layer provided between the second gate and the oxide semiconductor layer is controlled in accordance with a voltage between the second gate and the second source, whereby a channel which lies between the second source and the second drain is formed in the oxide semiconductor layer.

In a semiconductor element of one embodiment of the present invention, two different electrical switches are formed using a single oxide semiconductor layer. Therefore, the circuit area can be reduced as compared to the case where two electrical switches are separately provided (for example, the case where two transistors are separately provided). That is, a circuit is formed using the semiconductor element, whereby, an increase in the circuit area due to an increase in circuit scale can be suppressed.

BRIEF DESCRIPTION OF THE DRAWINGS

FIGS. 7A to 7C illustrate a structure of an oxide material according to one embodiment of the present invention.

FIGS. 8A to 8C illustrate a structure of an oxide material according to one embodiment of the present invention.

DETAILED DESCRIPTION OF THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the following description of the embodiments.

First, a semiconductor element according to one embodiment of the present invention will be described with reference to FIGS. 1A to 1C and FIGS. 2A to 2C.

<Structural Example of Semiconductor Element>

Figure 1A:
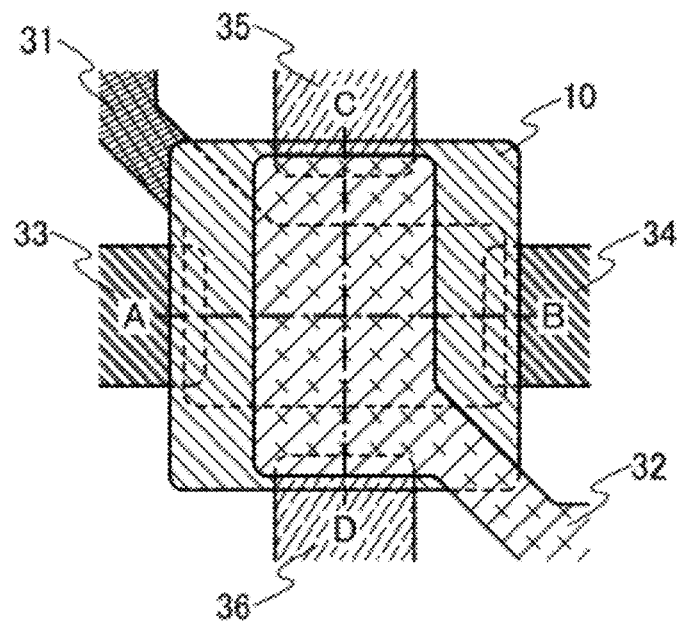
FIG. 1A is a top view and FIGS. 1B and 1C are cross-sectional views illustrating a structural example of a semiconductor element.
Figure 1B:
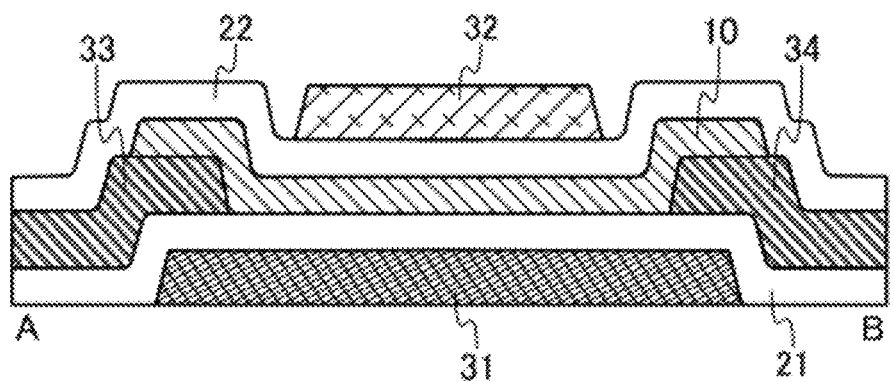
Figure 1C:
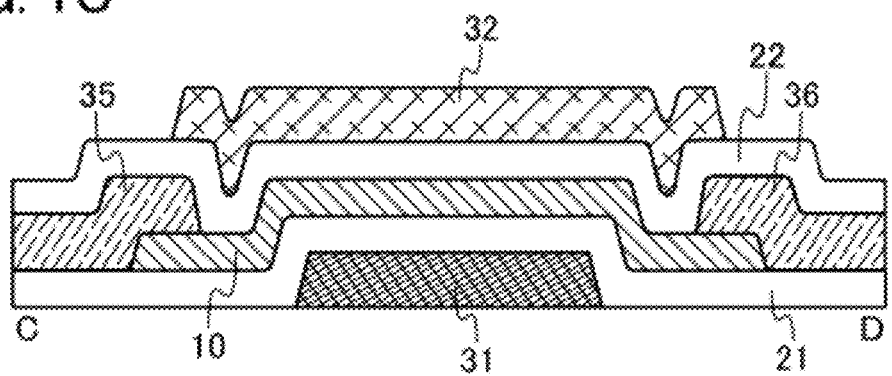

FIGS. 1A to 1C illustrate a structural example of a semiconductor element according to one embodiment of the present invention. FIG. 1A is a top view of the semiconductor element, and FIGS. 1B and 1C are a cross-sectional view along line A-B in FIG. 1A and a cross-sectional view along line C-D in FIG. 1A, respectively.

The semiconductor element illustrated in FIGS. 1A to 1C includes an oxide semiconductor layer 10, an insulating layer 21 in contact with a bottom surface of the oxide semiconductor layer 10, an insulating layer 22 in contact with a top surface of the oxide semiconductor layer 10, a conductive layer 31 overlapping with the oxide semiconductor layer 10 with the insulating layer 21 provided therebetween, a conductive layer 32 overlapping with the oxide semiconductor layer 10 with the insulating layer 22 provided therebetween, a conductive layer 33 in contact with the oxide semiconductor layer 10 at one end of the bottom surface of the oxide semiconductor layer 10, a conductive layer 34 in contact with the oxide semiconductor layer 10 at the other end of the bottom surface of the oxide semiconductor layer 10, a conductive layer 35 in contact with the oxide semiconductor layer 10 at one end of the top surface of the oxide semiconductor layer 10, and a conductive layer 36 in contact with the oxide semiconductor layer 10 at the other end of the top surface of the oxide semiconductor layer 10.

Note that, in other words, the semiconductor element illustrated in FIGS. 1A to 1C has two transistors between which the oxide semiconductor layer 10 is shared. Specifically, the semiconductor element has a first transistor including the conductive layer 31 serving as a gate, the insulating layer 21 serving as a gate insulating layer, the conductive layer 33 serving as a source, the conductive layer 34 serving as a drain, and the oxide semiconductor layer 10 and a second transistor including the conductive layer 32 serving as a gate, the insulating layer 22 serving as a gate insulating layer, the conductive layer 35 serving as a source, the conductive layer 36 serving as a drain, and the oxide semiconductor layer 10.

In the semiconductor element illustrated in FIGS. 1A to 1C, an electric field generated in the vicinity of the bottom surface of the oxide semiconductor layer 10 with the insulating layer 21 provided between the conductive layer 31 and the oxide semiconductor layer 10 can be controlled in accordance with a voltage between the conductive layer 31 (gate) and the conductive layer 33 (source). Therefore, a channel which lies between the conductive layer 33 (source) and the conductive layer 34 (drain) can be formed in the vicinity of the bottom surface of the oxide semiconductor layer 10. Similarly, in the semiconductor element, an electric field generated in the vicinity of the top surface of the oxide semiconductor layer 10 with the insulating layer 22 provided between the conductive layer 32 and the oxide semiconductor layer 10 can be controlled in accordance with a voltage between the conductive layer 32 (gate) and the conductive layer 35 (source). Therefore, a channel which lies between the conductive layer 35 (source) and the conductive layer 36 (drain) can be formed in the vicinity of the top surface of the oxide semiconductor layer 10. Note that in the semiconductor element illustrated in FIGS. 1A to 1C, the vicinity of the bottom surface of the oxide semiconductor layer 10 which is a region overlapping with the conductive layer 31 with only insulating layer 21 provided therebetween is a region mainly serving as a channel which lies between the conductive layers 33 and 34 and the vicinity of the top surface of the oxide semiconductor layer 10 which is a region overlapping with the conductive layer 32 with only insulating layer 22 provided therebetween is a region mainly serving as a channel which lies between the conductive layers 35 and 36.

As described above, in the semiconductor element illustrated in FIGS. 1A to 1C, the conduction state between the conductive layers 33 and 34 and the conduction state between the conductive layers 35 and 36 can be controlled by voltage control. Further, the former channel and the latter channel can be provided in different regions of the oxide semiconductor layer 10. Here, the oxide semiconductor has a wide band gap and low intrinsic carrier density. Therefore, current generated in a region of the oxide semiconductor layer 10 where a channel is not formed can be extremely low. Therefore, even when the former channel and the latter channel are formed at the same time, a current between the unintended conductive layers can be extremely low. Also, depending upon intended operation of the transistor, the two channels may not be necessarily separated from each other, in other words, the two channels may share a same region in the oxide semiconductor layer.

Note that the oxide semiconductor layer 10 may have a stacked structure. In that case, the oxide semiconductor layer 10 preferably includes an oxide insulator region interposed between oxide semiconductor regions. Specifically, the oxide semiconductor layer 10 is preferably constituted by a first oxide semiconductor region having a bottom surface, a second oxide semiconductor region having a top surface, and an oxide insulator region interposed between the first oxide semiconductor region and the second oxide semiconductor region. This is because even when both the channels are formed at the same time, a current generated between unintended conductive layers can be further reduced. Note that the oxide insulator region can be formed using aluminum oxide, silicon oxide, or the like. Further, a stacked layer thereof (for example, a stacked layer of a first silicon oxide region, an aluminum oxide region over the first silicon oxide region, and a second silicon oxide region over the aluminum oxide region) can be used.

Further, as the semiconductor element illustrated in FIGS. 1A to 1C, it is preferable that the semiconductor element includes a region where the channel which lies between the conductive layers 33 and 34 overlaps with the channel which lies between the conductive layers 35 and 36. This is because the circuit area can be reduced. However, in the semiconductor element disclosed in this specification, a region where a channel is formed in the oxide semiconductor layer is not limited to a specific region.

Further, as the semiconductor element illustrated in FIGS. 1A to 1C, the preferable structure is that the conductive layer 31 is closer to the conductive layers 33 and 34 than the conductive layer 32 is and the conductive layer 32 is closer to the conductive layers 35 and 36 than the conductive layer 31 is. This point will be specifically described below. In the semiconductor element, an electric field generated in the oxide semiconductor layer 10 is changed in accordance with potentials applied to each of the conductive layers 31 to 36. Then, a channel formed in the oxide semiconductor layer 10 depends on the electric field. For that reason, in the semiconductor element, unintended electrical connection between the two conductive layers (at least one of the conductive layers 33 and 34 and at least one of the conductive layers 35 and 36) may be caused. Therefore, with the structure of the semiconductor element illustrated in FIGS. 1A to 1C, the probability that unintended electrical connection between the two conductive layers is caused can be reduced.

<Modification Example of Semiconductor Element>

The semiconductor element illustrated in FIGS. 1A to 1C is one embodiment of the semiconductor element of the present invention and a semiconductor element having a different structure from the semiconductor element illustrated in FIGS. 1A to 1C is included in one embodiment of the present invention. For example, a semiconductor element illustrated in FIGS. 2A to 2C is one embodiment of the present invention.

Figure 2A:
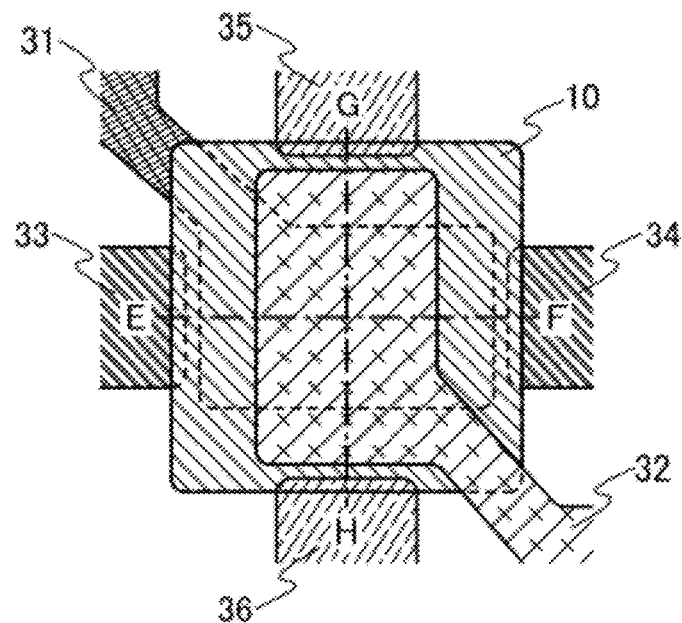
FIG. 2A is a top view and FIGS. 2B and 2C are cross-sectional views illustrating a structural example of a semiconductor element.
Figure 2B:
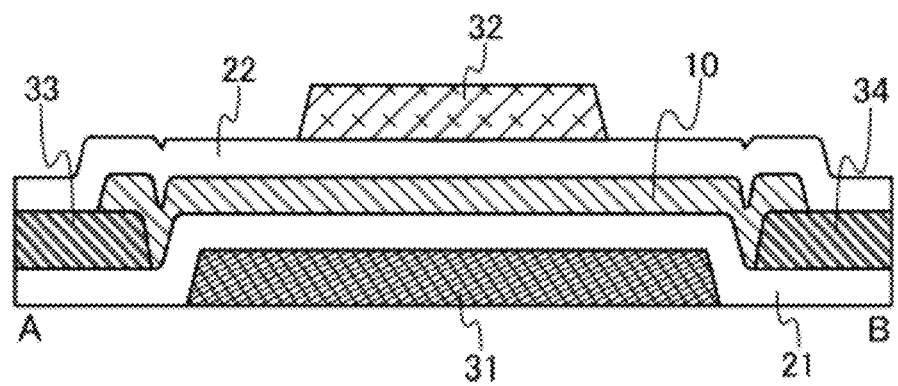
Figure 2C:
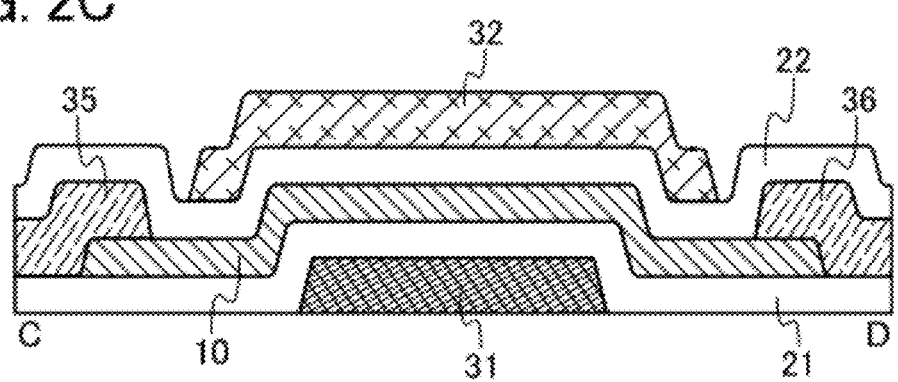

FIG. 2A is a top view of the semiconductor element, and FIGS. 2B and 2C are a cross-sectional view along line E-F in FIG. 2A and a cross-sectional view along line G-H in FIG. 2A, respectively.

The semiconductor element illustrated in FIGS. 2A to 2C includes the oxide semiconductor layer 10, the insulating layers 21 and 22, and the conductive layers 31 to 36, as in the semiconductor element illustrated in FIGS. 1A to 1C. Note that the semiconductor element illustrated in FIGS. 2A to 2C is different from that illustrated in FIGS. 1A to 1C in that one end of the conductive layer 31 does not overlap with one end of the conductive layer 33 with the insulating layer 21 provided therebetween and the other end of the conductive layer 31 does not overlap with one end of the conductive layer 34 with the insulating layer 21 provided therebetween. Similarly, the semiconductor element illustrated in FIGS. 2A to 2C is different from that illustrated in FIGS. 1A to 1C in that one end of the conductive layer 32 does not overlap with one end of the conductive layer 35 with the insulating layer 22 provided therebetween and the other end of the conductive layer 32 does not overlap with one end of the conductive layer 36 with the insulating layer 22 provided therebetween.

Therefore, in the semiconductor element illustrated in FIGS. 2A to 2C, as compared to the semiconductor element illustrated in FIGS. 1A to 1C, current generated in a state where a channel is not formed between the conductive layers 33 and 34 can be reduced and current generated in a state where a channel is not formed between the conductive layers 35 and 36 can be reduced. Further, in the semiconductor element illustrated in FIGS. 1A to 1C, as compared to the semiconductor element illustrated in FIGS. 2A to 2C, current generated in a state where a channel is formed between the conductive layers 33 and 34 can be increased and current generated in a state where a channel is formed between the conductive layers 35 and 36 can be increased.

<Oxide Semiconductor Layer 10>

The oxide semiconductor layer 10 included in the semiconductor element illustrated in FIGS. 1A to 1C and FIGS. 2A to 2C preferably contains at least indium (In) or zinc (Zn). In particular, the oxide semiconductor layer 10 preferably contains In and Zn. As a stabilizer for reducing change in electric characteristics of the semiconductor element including the oxide semiconductor layer 10, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor included in the oxide semiconductor layer 10, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. Further, Si may be contained in the above oxide semiconductor.

Note that, an In—Ga—Zn-based oxide semiconductor is an oxide semiconductor including indium (In), gallium (Ga), and zinc (Zn), and there is no limitation on the composition ratio thereof. Further, the In—Ga—Zn-based oxide semiconductor may contain a metal element other than In, Ga, and Zn.

For the oxide semiconductor layer, a thin film represented by $InMO_3(ZnO)_m$ (m>0) can be used. Here, M denotes one or more metal elements selected from Zn, Ga, Al, Mn, Fe, or Co. For example, M can be Ga, Ga and Al, Ga and Mn, Ga and Co, or the like. Alternatively, for the oxide semiconductor layer, a material represented by $In_3SnO_5(ZnO)_n$ (n>0, n is an integer) may be used.

More specifically, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions can be used.

In the case where an In—Zn-based material is used as the oxide semiconductor, the atomic ratio thereof is In/Zn=0.5 to 50, preferably In/Zn=1 to 20, more preferably In/Zn=1.5 to 15. When the atomic ratio of Zn is in the above preferred range, the field-effect mobility of the above semiconductor element can be improved. Here, when the atomic ratio of the compound is In:Zn:O=X:Y:Z, the relation Z>1.5X+Y is satisfied.

However, the composition is not limited to those described above, and a material having the appropriate composition may be used depending on required semiconductor characteristics (e.g., field-effect mobility). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, with the In—Sn—Zn-based oxide, high field-effect mobility can be relatively easily obtained. However, field-effect mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

Note that in the case where the oxide semiconductor layer 10 includes the first oxide semiconductor region, the second oxide semiconductor region, and the oxide insulator region as described above, the oxide semiconductor regions can be formed using at least one element selected from In, Ga, Sn, and Zn and the oxide insulator region can be formed using aluminum oxide, silicon oxide, or the like.

Further, it is preferable that the oxide semiconductor layer 10 be highly purified (be made to be i-type or substantially i-type) by reduction of impurities such as moisture or hydrogen, which serve as electron donors (donors). This is because current generated in a state where a channel is not formed in the oxide semiconductor layer 10 can be reduced. Specifically, the hydrogen concentration in the highly-purified oxide semiconductor layer 10 that is measured by secondary ion mass spectrometry (SIMS) is $5 \times 10^{19}/cm^3$ or lower, preferably $5 \times 10^{18}/cm^3$ or lower, more preferably $5 \times 10^{17}/cm^3$ or lower, still more preferably $1 \times 10^{16}/cm^3$ or lower. The carrier density of the oxide semiconductor layer, which can be measured by Hall effect measurement, is less than $1 \times 10^{14}/cm^3$, preferably less than $1 \times 10^{12}/cm^3$, further preferably less than $1 \times 10^{11}/cm^3$.

The analysis of the hydrogen concentration in the oxide semiconductor layer is described here. The hydrogen concentration in the semiconductor layer is measured by secondary ion mass spectrometry. It is known that it is difficult to obtain precise data in the vicinity of a surface of a sample or in the vicinity of an interface between stacked layers formed using different materials by a SIMS analysis in principle. Thus, in the case where the distribution of the hydrogen concentration of the layer in a thickness direction is analyzed by SIMS, an average value in a region of the layer, in which the value is not greatly changed and almost the same value can be obtained is employed as the hydrogen concentration. Further, in the case where the thickness of the layer is small, a region from which the values are almost the same can be obtained cannot be found in some cases due to the influence of the hydrogen concentration of the layers adjacent to each other. In that case, the maximum value or the minimum value of the hydrogen concentration in the region of the layer is employed as the hydrogen concentration of the layer. Further, in the case where a mountain-shaped peak having the maximum value or a valley-shaped peak having the minimum value do not exist in the region of the layer, the value at the inflection point is employed as the hydrogen concentration.

In the case where the oxide semiconductor layer 10 is formed by a sputtering method, it is important to reduce not only hydrogen concentration of a target but also water and hydrogen in a chamber, as much as possible. Specifically, for example, the following countermeasures are effective: the inside of the chamber is heated before the deposition; water and hydrogen concentration in a gas introduced in the chamber is reduced; and counter flow of an exhaust system, from which a gas in the chamber is exhausted, is prevented.

The oxide semiconductor may be either single crystal or non-single-crystal. In the latter case, the oxide semiconductor may be either amorphous or polycrystal. Further, the oxide semiconductor may have a structure which includes crystalline portions in an amorphous portion, or the oxide semiconductor may be non-amorphous.

In an oxide semiconductor in an amorphous state, a flat surface can be obtained relatively easily, so that when a semiconductor element is manufactured with the use of the oxide semiconductor, interface scattering can be reduced, and relatively high mobility can be obtained relatively easily.

In an oxide semiconductor having crystallinity, defects in the bulk can be further reduced and when the surface flatness of the oxide semiconductor is improved, field-effect mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents an area of a plane to be measured (a rectangular region which is defined by four points represented by the coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

Further, an oxide semiconductor (CAAC-OS) film including a crystal with c-axis alignment (also referred to as c-axis aligned crystal (CAAC)) can be used as an example of the oxide semiconductor layer 10 which is non-single-crystal.

Specifically, a CAAC-OS film has a hexagonal crystal structure including zinc, in which bonds for forming hexagonal lattices are formed in the a-b plane which is parallel to a film surface on which the CAAC-OS film is deposited and c-axes are substantially perpendicular to the a-b plane.

The CAAC-OS film is not a single crystal, but this does not mean that the CAAC-OS film is composed of only an amorphous component. Although the CAAC-OS film includes a crystallized portion (a crystalline portion), a boundary between one crystalline portion and another crystalline portion is not clear in some cases.

Nitrogen may be substituted for part of oxygen included in the CAAC-OS film. The c-axes of individual crystalline portions included in the CAAC-OS film may be aligned in one direction (e.g., the direction perpendicular to a surface of a substrate over which the CAAC-OS film is formed, a surface of the CAAC-OS film, or the like). Alternatively, the normals of the a-b planes of individual crystalline portions included in the CAAC-OS film may be aligned in one direction (e.g., the direction perpendicular to a surface of a substrate over which the CAAC-OS film is formed, a surface of the CAAC-OS film, or the like).

The CAAC-OS film is a conductor, a semiconductor, or an insulator depending on its composition or the like. The CAAC-OS film transmits or does not transmit visible light depending on its composition or the like.

An example of such a CAAC-OS film is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

In the CAAC-OS film, metal atoms and oxygen atoms are bonded in an orderly manner in comparison with an amorphous oxide semiconductor. That is to say, in the case where an oxide semiconductor is amorphous, the coordination numbers might vary between various metal atoms, but the coordination numbers of metal atoms are almost the same as each other in the CAAC-OS film. Therefore, microscopic oxygen deficiency is reduced and the instability or movement of charge due to attachment and detachment of hydrogen atoms (including hydrogen ions) or alkali metal atoms is reduced.

Therefore, the oxide semiconductor layer 10 is formed using the CAAC-OS film, whereby the reliability of the above semiconductor element can be improved.

Note that in the case where the CAAC-OS film is deposited by a sputtering method, the proportion of oxygen gas in an atmosphere is preferably set high. When a sputtering method is performed in a mixed gas atmosphere of argon and oxygen, for example, the proportion of oxygen gas is preferably set 30% or more, more preferably 40% or more. This is because supply of oxygen from atmosphere promotes the crystallization of the CAAC-OS film.

Further, in the case where the CAAC-OS film is deposited by a sputtering method, a substrate over which the CAAC-OS film is deposited is heated preferably to 150° C. or more, more preferably to 170° C. or more. This is because the higher the substrate temperature, the more the crystallization of the CAAC-OS film is promoted.

After being subjected to heat treatment in a nitrogen atmosphere or in vacuum, the CAAC-OS film is preferably subjected to heat treatment in an oxygen atmosphere or a mixed atmosphere of oxygen and another gas. This is because oxygen deficiency due to the former heat treatment can be compensated by supply of oxygen from atmosphere in the latter heat treatment.

A film surface on which the CAAC-OS film is deposited (deposition surface) is preferably flat. This is because irregularity of the deposition surface causes grain boundaries in the CAAC-OS film inasmuch as the c-axis approximately perpendicular to the deposition surface exists in the CAAC-OS film. For this reason, the deposition surface is preferably subjected to planarization such as chemical mechanical polishing (CMP) before the CAAC-OS film is formed. The average roughness of the deposition surface is preferably 0.5 nm or less, more preferably 0.3 nm or less.

<Insulating Layers 21 and 22>

As the insulating layers 21 and 22 included in the semiconductor elements illustrated in FIGS. 1A to 1C and FIGS. 2A to 2C, an insulator such as silicon oxide, silicon nitride, silicon oxynitride, silicon nitride oxide, aluminum oxide, or tantalum oxide can be used. A stacked structure of these materials can also be used. Note that silicon oxynitride refers to a substance which contains more oxygen than nitrogen and contains oxygen, nitrogen, silicon, and hydrogen at given concentrations ranging from 55 atomic % to 65 atomic %, 1 atomic % to 20 atomic %, 25 atomic % to 35 atomic %, and 0.1 atomic % to 10 atomic %, respectively, where the total percentage of atoms is 100 atomic %. Further, the silicon nitride oxide film refers to a film which contains more nitrogen than oxygen and contains oxygen, nitrogen, silicon, and hydrogen at given concentrations ranging from 15 atomic % to 30 atomic %, 20 atomic % to 35 atomic %, 25 atomic % to 35 atomic %, and 15 atomic % to 25 atomic %, respectively, where the total percentage of atoms is 100 atomic %.

<Conductive Layers 31 to 36>

As the conductive layers 31 to 36 included in the semiconductor elements illustrated in FIGS. 1A to 1C and FIGS. 2A to 2C, an element selected from aluminum (Al), copper (Cu), titanium (Ti), tantalum (Ta), tungsten (W), molybdenum (Mo), chromium (Cr), neodymium (Nd), and scandium (Sc), an alloy containing any of these elements, or a nitride containing any of these elements can be used. A stacked structure of these materials can also be used.

<Example of CAAC>

Next, an example of the above CAAC will be described in detail with reference to FIGS. 6A to 6E, FIGS. 7A to 7C, and FIGS. 8A to 8C. In FIGS. 6A to 6E, FIGS. 7A to 7C, and FIGS. 8A to 8C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Further, in FIGS. 6A to 6E, O surrounded by a circle represents tetracoordinate O and O surrounded by a double circle represents tricoordinate O.

Figure 6A:
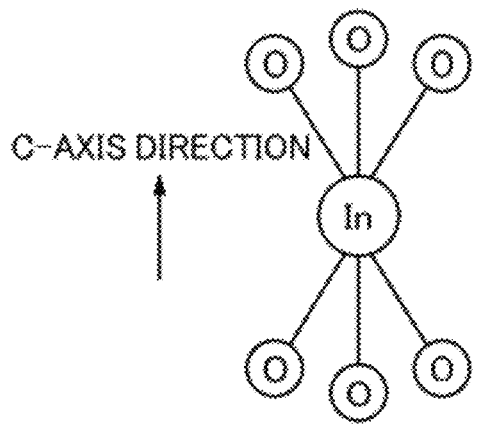
FIGS. 6A to 6E illustrate structures of oxide materials according to one embodiment of the present invention.

FIG. 6A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 6A is actually an octahedral structure, but is illustrated as a planar structure for simplicity. Note that three tetracoordinate O atoms exist in each of an upper half and a lower half in FIG. 6A. In the small group illustrated in FIG. 6A, electric charge is 0.

Figure 6D:
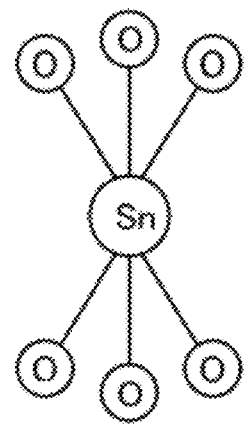
Figure 6B:
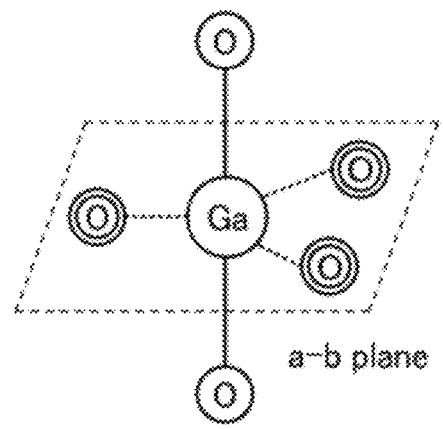

FIG. 6B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 6B. An In atom can also have the structure illustrated in FIG. 6B because an In atom can have five ligands. In the small group illustrated in FIG. 6B, electric charge is 0.

Figure 6E:
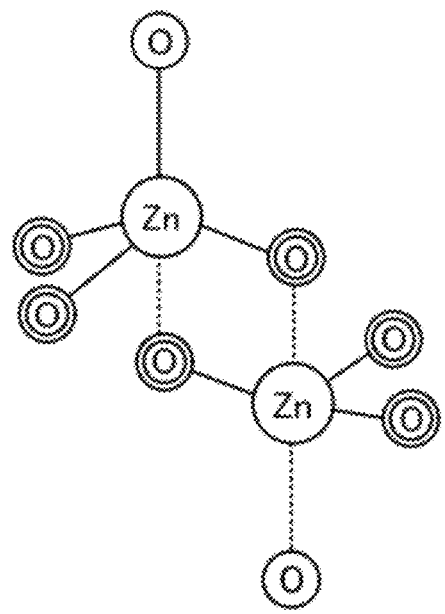
Figure 6C:
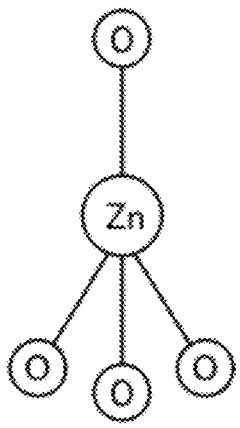

FIG. 6C illustrates a structure including one tetracoordinate Zn atom and four tetracoordinate O atoms proximate to the Zn atom. In FIG. 6C, one tetracoordinate O atom exists in an upper half and three tetracoordinate O atoms exist in a lower half Alternatively, three tetracoordinate O atoms may exist in the upper half and one tetracoordinate O atom may exist in the lower half in FIG. 6C. In the small group illustrated in FIG. 6C, electric charge is 0.

FIG. 6D illustrates a structure including one hexacoordinate Sn atom and six tetracoordinate O atoms proximate to the Sn atom. In FIG. 6D, three tetracoordinate O atoms exist in each of an upper half and a lower half In the small group illustrated in FIG. 6D, electric charge is +1.

FIG. 6E illustrates a small group including two Zn atoms. In FIG. 6E, one tetracoordinate O atom exists in each of an upper half and a lower half In the small group illustrated in FIG. 6E, electric charge is −1.

Here, a plurality of small groups forms a medium group, and a plurality of medium groups forms a large group (also referred to as a unit cell).

Now, a rule of bonding between the small groups will be described. The three O atoms in the upper half with respect to the hexacoordinate In atom in FIG. 6A each have three proximate In atoms in the downward direction, and the three O atoms in the lower half each have three proximate In atoms in the upward direction. The one O atom in the upper half with respect to the pentacoordinate Ga atom in FIG. 6B has one proximate Ga atom in the downward direction, and the one O atom in the lower half has one proximate Ga atom in the upward direction. The one O atom in the upper half with respect to the tetracoordinate Zn atom in FIG. 6C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 7A illustrates a model of a medium group included in a layered structure of an In—Sn—Zn—O-based material. FIG. 7B illustrates a large group including three medium groups. Note that FIG. 7C illustrates an atomic arrangement in the case where the layered structure in FIG. 7B is observed from the c-axis direction.

In FIG. 7A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 7A, one tetracoordinate O atom existing in each of an upper half and a lower half with respect to an In atom is denoted by circled 1. FIG. 7A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 7A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 6E can be given. For example, with one small group including two Zn atoms, electric charge of one small group including a Sn atom can be cancelled, so that the total electric charge of the layered structure can be 0.

When the large group illustrated in FIG. 7B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

FIG. 8A illustrates a model of a medium group included in a layered structure of an In—Ga—Zn—O-based material.

In the medium group included in the layered structure of the In—Ga—Zn—O-based material in FIG. 8A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 8B illustrates a large group including three medium groups. Note that FIG. 8C illustrates an atomic arrangement in the case where the layered structure in FIG. 8B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 8A but also a medium group in which the arrangement of the In atom, the Ga atom, and the Zn atom is different from that in FIG. 8A.

<Memory Circuit Including Semiconductor Element>

Figure 3A:
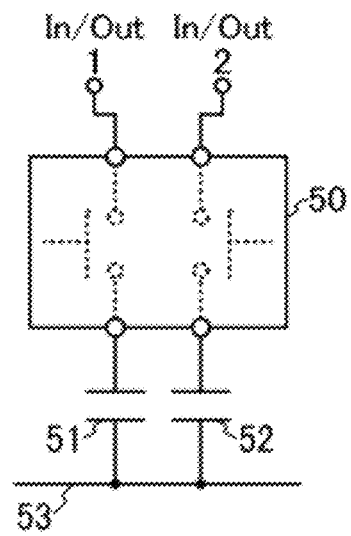
FIGS. 3A and 3B are diagrams each illustrating a structural example of a memory circuit.
Figure 3B:
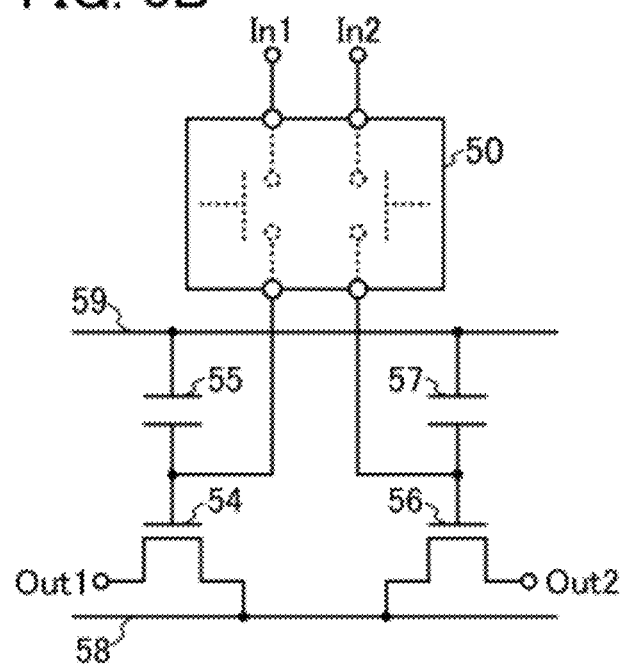

Next, a memory circuit including the above semiconductor element will be described with reference to FIGS. 3A and 3B. FIGS. 3A and 3B are diagrams each illustrating a structural example of the memory circuit. Specifically, FIGS. 3A and 3B are diagrams each illustrating a structural example of the memory circuit including the above semiconductor element and two memory elements. In other words, the semiconductor element includes four terminals (corresponding to the conductive layers 33 to 36 in FIGS. 1A to 1C and FIGS. 2A to 2C), which are electrically connected to the oxide semiconductor layer 10. Further, the semiconductor element can be regarded to have a function of controlling electrical connection between two terminals of the four terminals and electrical connection between the other two terminals. In view of the above, in this specification, reference numeral represented by 50 in FIGS. 3A and 3B is used as reference numeral which represents the above semiconductor element.

The memory circuit in FIG. 3A includes a semiconductor element 50 in which a first terminal functions as a first input/output terminal (In/Out 1) and a second terminal functions as a second input/output terminal (In/Out 2), a capacitor 51 in which one electrode is electrically connected to a third terminal of the semiconductor element 50 and the other electrode is electrically connected to a wiring 53 that supplies a fixed potential, and a capacitor 52 in which one electrode is electrically connected to a fourth terminal of the semiconductor element 50 and the other electrode is electrically connected to the wiring 53 that supplies a fixed potential.

Note that, in other words, the memory circuit in FIG. 3A includes a memory element which holds data at a first node where the third terminal of the semiconductor element 50 and one electrode of the capacitor 51 are electrically connected to each other and a memory element which holds data at a second node where the fourth terminal of the semiconductor element 50 and one electrode of the capacitor 52 are electrically connected to each other. As the fixed potential, a ground potential (GND), 0 V, or the like can be employed.

In the memory circuit in FIG. 3A, the potential of each of the first node and the second node (charge held in each of the capacitor 51 and the capacitor 52) can correspond to two-level or multi-level data. Specifically, at the time of reading of data, the potential of the wiring which is electrically connected to the first input/output terminal or the second input/output terminal changes in accordance with the potential of each of the first node and the second node (charge held in each of the capacitor 51 and the capacitor 52). The held data can be determined in accordance with the value of the potential of the wiring at this time.

The memory circuit in FIG. 3B includes the semiconductor element 50 in which a first terminal functions as a first input terminal (In 1) and a second terminal functions as a second input terminal (In 2), a transistor 54 in which a gate is electrically connected to a third terminal of the semiconductor element 50, one of a source and a drain is electrically connected to a wiring 58 that supplies a fixed potential, and the other of the source and the drain functions as a first output terminal (Out1), a capacitor 55 in which one electrode is electrically connected to the third terminal of the semiconductor element 50 and the gate of the transistor 54 and the other electrode is electrically connected to a read word line 59, a transistor 56 in which a gate is electrically connected to a fourth terminal of the semiconductor element 50, one of a source and a drain is electrically connected to the wiring 58 that supplies a fixed potential, and the other of the source and the drain functions as a second output terminal (Out 2), and a capacitor 57 in which one electrode is electrically connected to the fourth terminal of the semiconductor element 50 and the gate of the transistor 56 and the other electrode is electrically connected to the read word line 59.

Note that, in other words, the memory circuit in FIG. 3B includes a memory element which holds data at a first node where the third terminal of the semiconductor element 50, the gate of the transistor 54, and one electrode of the capacitor 55 are electrically connected to each other and a memory element which holds data at a second node where the fourth terminal of the semiconductor element 50, the gate of the transistor 56, and one electrode of the capacitor 57 are electrically connected to each other. As the fixed potential, a ground potential (GND), 0 V, or the like can be employed. Note that there is no particular limitation on the semiconductor material used for the transistors 54 and 56.

In the memory circuit in FIG. 3B, switching of the transistors 54 and 56 can be controlled in accordance with the potential of the first node or the second node. In addition, the potentials of the first node and the second node can be controlled by capacitive coupling with the read word line 59. The memory circuit illustrated in FIG. 3B can therefore store multi-level data. That is, by identifying the conduction state (the on state or the off state) of each of the transistors 54 and 56 under a plurality of conditions with different potentials of the reading word line 59, reading of data can be performed even when the potential of the first node or the second node is a multi-level potential. Note that the reading of data can be performed by, for example, identifying an output signal of a voltage divider circuit including the transistor 54 or the transistor 56. Further, the memory circuit in FIG. 3B can also be used as a memory cell that holds two-level data.

In the memory circuits in FIGS. 3A and 3B, the input of data to two memory elements can be controlled by the single semiconductor element 50. Therefore, the circuit area can be reduced as compared to the case where switches are provided for respective two memory elements.

<Integrated Circuit Including Memory Circuit>

Figure 4A:
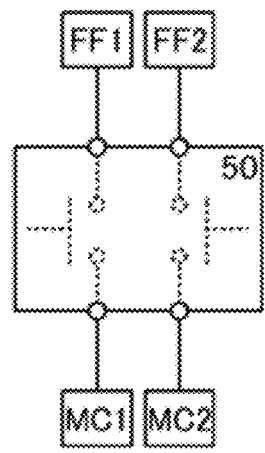
FIGS. 4A and 4B are block diagrams each illustrating a structural example of an integrated circuit and FIG. 4C is a flowchart illustrating an operation example thereof.
Figure 4B:
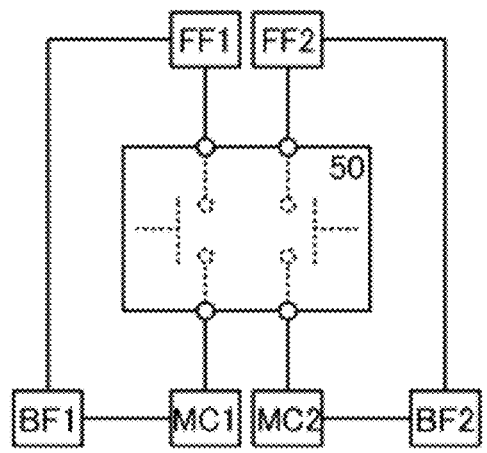

Next, an integrated circuit including the above memory circuit will be described with reference to FIGS. 4A, 4B, and 4C. FIGS. 4A and 4B are block diagrams each illustrating a structural example of the integrated circuit and FIG. 4C is a flowchart illustrating an operation example of the integrated circuit.

FIG. 4A is a block diagram illustrating an integrated circuit in which data can be directly transmitted and received between two flip-flops (FF1 and FF2) and two memory elements (MC1 and MC2) through the semiconductor element 50 and FIG. 4B is a block diagram illustrating an integrated circuit in which data can be transmitted from the two flip-flops (FF1 and FF2) to the two memory elements (MC1 and MC2) through the semiconductor element 50 and data can be transmitted from the two memory elements to the two flip-flops (FF1 and FF2) through buffers (BF1 and BF2). For example, as the integrated circuit including the memory circuit in FIG. 3A, the structure in FIG. 4A can be used and as the integrated circuit including the memory circuit in FIG. 3B, the structure in FIG. 4B can be used.

Note that as the flip-flops (FF1 and FF2) in FIGS. 4A and 4B, any circuit as long as it is a volatile memory capable of holding 1-bit data may be used. Further, as the buffers (BF1 and BF2) in FIG. 4B, any circuit as long as it can transmit the data held in the memory elements (MC1 and MC2) to the flip-flops (FF1 and FF2) may be used.

Figure 4C:
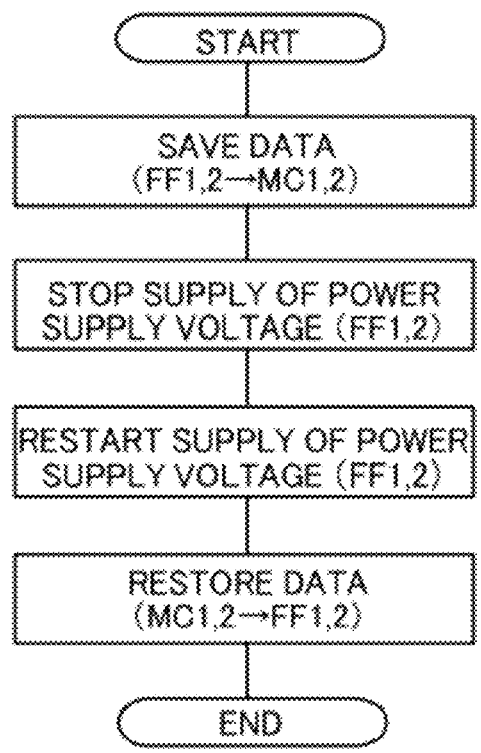

FIG. 4C is a flowchart illustrating an operation example of the case where the supply of the power supply voltage to the flip-flops (FF1 and FF2) is stopped. Here, the semiconductor element 50 in which formation of a channel in the oxide semiconductor layer 10 is controlled is an element functioning as a switch. As described above, current generated in a region of the oxide semiconductor layer 10 where a channel is not formed can be extremely reduced. Therefore, the memory elements (MC1 and MC2) can hold data for a long time.

As shown in FIG. 4C, in the integrated circuit, the data held in the flip-flops (FF1 and FF2) is transmitted to the memory elements (MC1 and MC2) before the supply of the power supply voltage is stopped. This is to save data that is erased from the flip-flops (FF1 and FF2) owing to the stop of the supply of the power supply voltage. Note that in the semiconductor element 50, transmission of data from the flip-flop (FF1) to the memory element (MC1) and transmission of data from the flip-flop (FF2) to the memory element (MC2) can be performed at the same time.

Next, the supply of the power supply voltage to the flip-flops (FF1 and FF2) is stopped. Thus, power consumption of the integrated circuit can be reduced.

Then, the supply of the supply voltage to the flip-flops (FF1 and FF2) is restarted.

After that, the data held in the memory elements (MC1 and MC2) is transmitted to the flip-flops (FF1 and FF2). This is to restore the data in the flip-flops (FF1 and FF2). Note that in the semiconductor element 50 in FIG. 4A, transmission of data from the memory element (MC1) to the flip-flop (FF1) and transmission of data from the memory element (MC2) to the flip-flop (FF2) can be performed at the same time.

The integrated circuits in FIGS. 4A and 4B each include the semiconductor element 50. Therefore, the circuit area can be reduced. By the operation shown in FIG. 4C, power consumption of the integrated circuit can be reduced. Further, in the integrated circuit, transmission of data from the two flip-flops (FF1 and FF2) to the two memory elements (MC1 and MC2) or transmission of data from the two memory elements (MC1 and MC2) to the two flip-flops (FF1 and FF2) can be performed at the same time, whereby operation speed can be improved.

<Structural Example of Integrated Circuit>

Next, a structural example of the above integrated circuit will be described with reference to FIG. 5.

The flip-flops (FF1 and FF2) included in the integrated circuit are formed using a transistor and the like. The transistor preferably has high field-effect mobility. Therefore, it is preferable that the transistor have its channel in a polycrystalline silicon layer or a single crystal silicon layer while the semiconductor element 50 has its channel in the oxide semiconductor layer 10.

Figure 5:
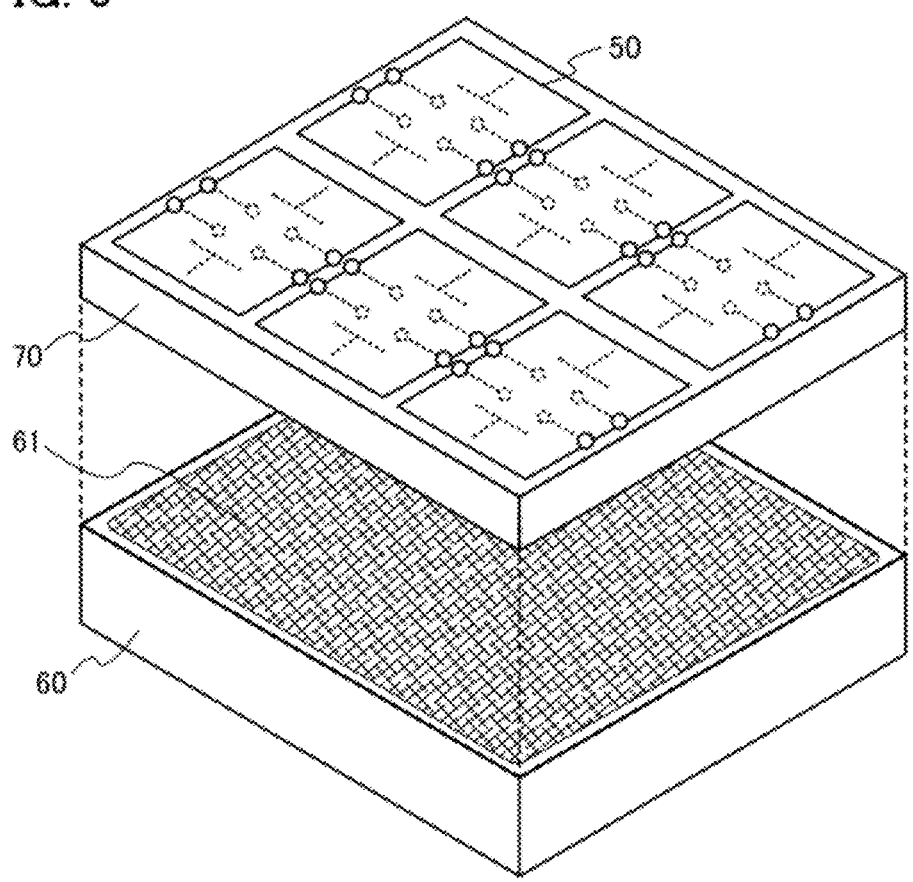
FIG. 5 is a diagram illustrating a structural example of an integrated circuit.

FIG. 5 is a diagram illustrating a structural example of the above integrated circuit. The integrated circuit in FIG. 5 includes a single crystal silicon substrate 60 and a layer 70. The single crystal silicon substrate 60 has a functional circuit portion 61 including the flip-flop and the like. The layer 70 has the semiconductor elements 50 provided in a region overlapping with the functional circuit portion 61. Further, the flip-flop is electrically connected to the semiconductor element 50 through an opening provided in the layer 70. It is preferable that in the integrated circuit, the functional circuit portion 61 overlap with the semiconductor element 50, as illustrated in FIG. 5. This is because the circuit area can be further reduced.

It is to be noted that the integration circuit disclosed in this specification does not necessarily have the structure illustrated in FIG. 5. Although FIG. 5 illustrates an integrated circuit including the single crystal silicon substrate 60 as an example, the single crystal silicon substrate 60 can be replaced with a substrate (what is called an SOI substrate) where a single crystal silicon layer is provided over an insulating surface.

This application is based on Japanese Patent Application serial no. 2011-090843 filed with Japan Patent Office on Apr. 15, 2011 and Japanese Patent Application serial no. 2011-112792 filed with Japan Patent Office on May 19, 2011, the entire contents of which are hereby incorporated by reference.

What is claimed is:

1. A semiconductor element comprising:
   an oxide semiconductor layer;
   a first insulating layer in contact with a first surface of the oxide semiconductor layer;
   a second insulating layer in contact with a second surface which is a back surface of the first surface of the oxide semiconductor layer;
   a first conductive layer overlapping with the oxide semiconductor layer with the first insulating layer provided therebetween;
   a second conductive layer overlapping with the oxide semiconductor layer with the second insulating layer provided therebetween;
   a third conductive layer in electrical contact with the oxide semiconductor layer at one end of the first surface;
   a fourth conductive layer in electrical contact with the oxide semiconductor layer at the other end of the first surface;
   a fifth conductive layer in electrical contact with the oxide semiconductor layer at one end of the second surface; and
   a sixth conductive layer in electrical contact with the oxide semiconductor layer at the other end of the second surface.

2. The semiconductor element according to claim 1,
   wherein one end of the first conductive layer overlaps with one end of the third conductive layer with the first insulating layer provided therebetween and the other end of the first conductive layer overlaps with one end of the fourth conductive layer with the first insulating layer provided therebetween, and wherein one end of the second conductive layer overlaps with one end of the fifth conductive layer with the second insulating layer provided therebetween and the other end of the second conductive layer overlaps with one end of the sixth conductive layer with the second insulating layer provided therebetween.

3. The semiconductor element according to claim 1,
wherein one end of the first conductive layer does not overlap with one end of the third conductive layer with the first insulating layer provided therebetween and the other end of the first conductive layer does not overlap with one end of the fourth conductive layer with the first insulating layer provided therebetween, and
wherein one end of the second conductive layer does not overlap with one end of the fifth conductive layer with the second insulating layer provided therebetween and the other end of the second conductive layer does not overlap with one end of the sixth conductive layer with the second insulating layer provided therebetween.

4. The semiconductor element according to claim 1, wherein the oxide semiconductor layer includes a first oxide semiconductor region having the first surface, a second oxide semiconductor region having the second surface, and an oxide insulator region interposed between the first oxide semiconductor region and the second oxide semiconductor region.

5. The semiconductor element according to claim 1, wherein the first conductive layer is closer to the third conductive layer and the fourth conductive layer than the second conductive layer is, and the second conductive layer is closer to the fifth conductive layer and the sixth conductive layer than the first conductive layer is.

6. A memory circuit comprising:
the semiconductor element according to claim 1,
a first memory element which holds data at a node electrically connected to the fourth conductive layer of the semiconductor element, and
a second memory element which holds data at a node electrically connected to the sixth conductive layer of the semiconductor element.

7. An integrated circuit comprising:
the memory circuit according to claim 6;
a first flip-flop electrically connected to the third conductive layer; and
a second flip-flop electrically connected to the fifth conductive layer.

8. The integrated circuit according to claim 7,
wherein the semiconductor element is provided in a region overlapping with the first flip-flop or the second flip-flop, and
wherein the first flip-flop and the second flip-flop include a transistor whose channel is formed in a polycrystalline silicon layer or a single crystal silicon layer.

9. A method for driving the integrated circuit according to claim 8, comprising the steps of:
transmitting data held in the first flip-flop and data held in the second flip-flop to the first memory element and the second memory element, respectively, before a period in which the supply of a power supply voltage to the first flip-flop and the second flip-flop is stopped;
holding the data in the first memory element and the data in the second memory element during the period; and
transmitting the data held in the first memory element to the first flip-flop, so that the data of the first flip-flop is restored and transmitting the data held in the second memory element to the second flip-flop, so that the data of the second flip-flop is restored, after the period.

10. The method for driving the integrated circuit according to claim 9,
wherein transmission of the data from the first flip-flop to the first memory element and transmission of the data from the second flip-flop to the second memory element are performed at the same time before the period.

11. The method for driving the integrated circuit according to claim 9,
wherein transmission of the data from the first memory element to the first flip-flop and transmission of the data from the second memory element to the second flip-flop are performed at the same time after the period.

* * * * *